(12) United States Patent
Tan et al.

(10) Patent No.: US 11,462,622 B1
(45) Date of Patent: Oct. 4, 2022

(54) MEMORY CELLS AND METHODS OF FORMING A MEMORY CELL

(71) Applicant: GLOBALFOUNDRIES Singapore Pte. Ltd., Singapore (SG)

(72) Inventors: Kian Ming Tan, Singapore (SG); Khee Yong Lim, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/355,257

(22) Filed: Jun. 23, 2021

(51) Int. Cl.
| | | |
|---|---|---|
| *H01L 21/00* | (2006.01) |
| *H01L 29/423* | (2006.01) |
| *H01L 27/11521* | (2017.01) |
| *H01L 29/66* | (2006.01) |
| *H01L 21/28* | (2006.01) |
| *H01L 29/788* | (2006.01) |

(52) U.S. Cl.
CPC .. *H01L 29/42328* (2013.01); *H01L 27/11521* (2013.01); *H01L 29/40114* (2019.08); *H01L 29/66825* (2013.01); *H01L 29/7881* (2013.01)

(58) Field of Classification Search
CPC ......... H01L 29/42328; H01L 29/40114; H01L 27/11521; H01L 29/66825; H01L 29/7881
See application file for complete search history.

(56) References Cited

U.S. PATENT DOCUMENTS

| 9,917,165 | B2 | 3/2018 | Wu et al. |
| 10,418,451 | B1 * | 9/2019 | Do ..................... H01L 29/0847 |
| 2006/0202255 | A1 * | 9/2006 | Jeon ..................... H01L 27/115 438/211 |
| 2008/0217675 | A1 | 9/2008 | Liu et al. |
| 2010/0054043 | A1 | 3/2010 | Liu et al. |
| 2016/0336415 | A1 * | 11/2016 | Wu ................... H01L 29/40114 |

FOREIGN PATENT DOCUMENTS

| CN | 106298672 A | 1/2017 |
| WO | 2013032585 A1 | 3/2013 |

OTHER PUBLICATIONS

Chien-Ting Lin, "Impacts of Notched-Gate Structure on Contact Etch Stop Layer (CESL) Stressed 90-nm nMOSFET", IEEE Electron Device Letters, May 5, 2007, pp. 376-378, vol. 28.

* cited by examiner

*Primary Examiner* — Richard A Booth
(74) *Attorney, Agent, or Firm* — Viering Jentschura & Partner MBB

(57) ABSTRACT

According to various embodiments, a memory cell may include a substrate of a first conductivity type, the substrate having first and second regions of a second conductivity type spaced apart and defining a channel region therebetween. The memory cell may further include a word line arranged over a portion of the channel region nearer to the first region, an erase gate arranged over the second region, a floating gate arranged over another portion of the channel region nearer to the second region and between the word line and the erase gate, and a coupling gate arranged over a top end of the floating gate. The floating gate includes the top end, a bottom end, a first side extending from the top end to the bottom end and facing the erase gate, and a second side extending from the top end to the bottom end and facing the word line. A first lateral distance between the bottom end of the floating gate and the erase gate may be larger than a second lateral distance between the top end of the floating gate and the erase gate.

20 Claims, 9 Drawing Sheets

MEMORY CELLS AND METHODS OF FORMING A MEMORY CELL

TECHNICAL FIELD

Various embodiments relate to memory cells, and more particular, to nonvolatile memory cells and methods of fabricating memory cells.

BACKGROUND

Flash memory is an electronic non-volatile computer storage medium that can be electrically erased and reprogrammed. Flash memory may include a plurality of flash memory cells. One type of flash memory cells is a split gate memory cell. Split gate memory cells have several advantages over other types of flash memory cells such as the stacked gate memory cells. These advantages include lower power consumption, higher injection efficiency, less susceptibility to short channel effects, and over erase immunity. The erase performance of split gate memory cells improves when the erase gate-floating gate coupling ratio is reduced. The erase gate-floating gate coupling ratio can be reduced by making the floating gate structure thinner. However, it is challenging to manufacture the memory cell with a very thin floating gate structure as the manufacturing process may result in damage to the underlying semiconductor material.

SUMMARY

According to various embodiments, there may be provided a memory cell. The memory cell may include a substrate of a first conductivity type, the substrate having first and second regions of a second conductivity type spaced apart and defining a channel region therebetween. The memory cell may further include a word line arranged over a portion of the channel region nearer to the first region, an erase gate arranged over the second region, a floating gate arranged over another portion of the channel region nearer to the second region and between the word line and the erase gate, and a coupling gate arranged over a top end of the floating gate. The floating gate includes the top end, a bottom end, a first side extending from the top end to the bottom end and facing the erase gate, and a second side extending from the top end to the bottom end and facing the word line. A first lateral distance between the bottom end of the floating gate and the erase gate may be larger than a second lateral distance between the top end of the floating gate and the erase gate.

According to various embodiments, there may be provided a method of forming a memory cell. The method may include forming a substrate of a first conductivity type with first and second regions of a second conductivity type spaced apart therein so as to define a channel region therebetween. The method may further include forming a word line over a portion of the channel region nearer to the first region, forming an erase gate over the second region, forming a floating gate over another portion of the channel region nearer to the second region and between the word line and the erase gate, and forming a coupling gate over a top end of the floating gate. The floating gate may include the top end, a bottom end, a first side extending from the top end to the bottom end and facing the erase gate, and a second side extending from the top end to the bottom end and facing the word line. A first lateral distance between the bottom end of the floating gate and the erase gate may be larger than a second lateral distance between the top end of the floating gate and the erase gate.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
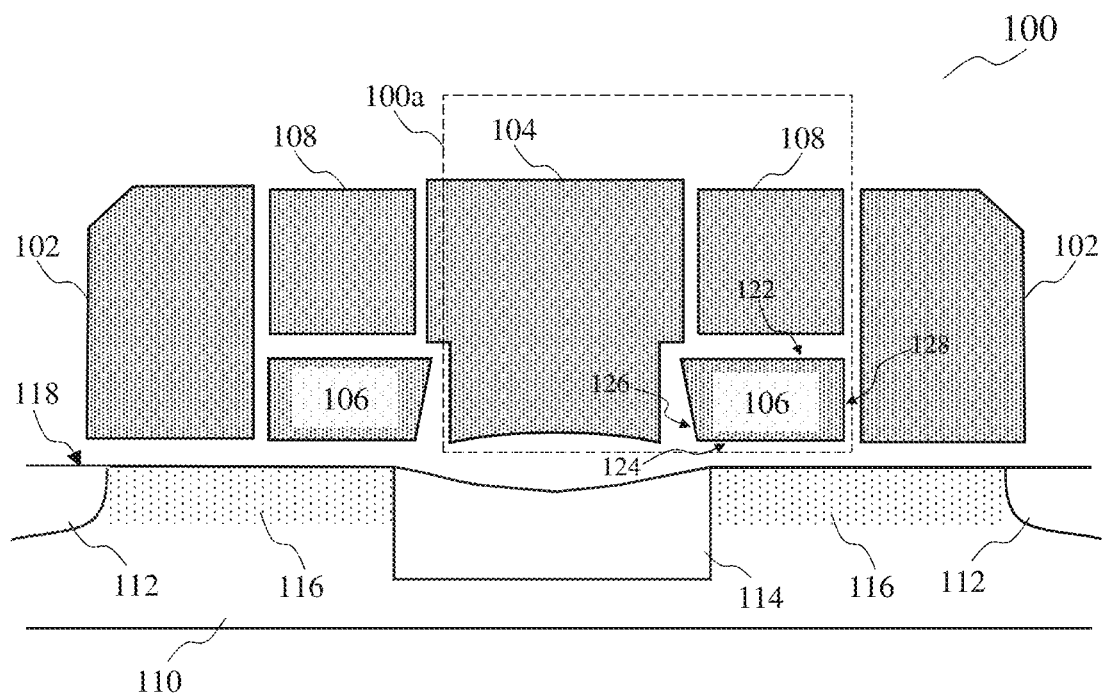
FIGS. 1A and 1B show simplified cross-sectional views of a memory cell according to various non-limiting embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

The embodiments generally relate to memory cells. More particularly, some embodiments relate to flash memory devices, and split-gate non-volatile memory cells.

Figure 1B:
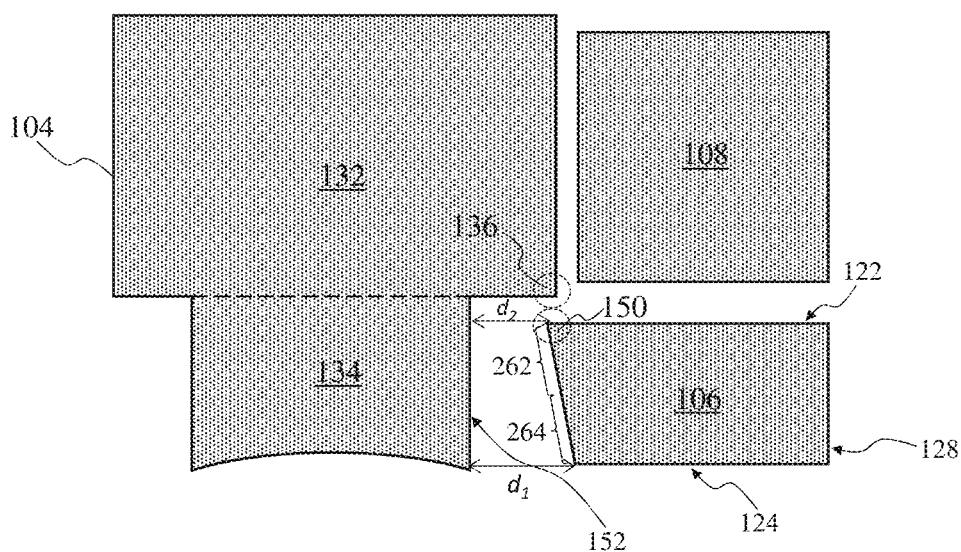

FIGS. 1A and 1B show simplified cross-sectional views of a memory cell 100 according to various non-limiting embodiments.

As shown in FIG. 1A, the memory cell 100 may include a substrate 110 that includes a first region 112 and a second region 114. The substrate 110 may have a first conductivity type, while both the first region 112 and the second region 114 may have a second conductivity type that is different from the first conductivity type. For example, the second conductivity type may be p-type while the first conductivity type may be n-type, or vice-versa. The first region 112 and the second region 114 may be spaced apart, and may define a channel region 116 between them. The substrate 110 has an upper surface 118. Both the first region 112 and the second region 114 may be provided along the upper surface 118 of the substrate 110. The substrate 110 may be formed from a semiconductor, for example, silicon. The first region 112 and the second region 114 may be formed in the substrate 110 by implanting those regions of the substrate 110 with dopants of the second conductivity type.

The memory cell 100 may further include a word line 102, an erase gate 104, a floating gate 106 and a coupling gate 108 disposed over the substrate 110. The word line 102 may be arranged over a first portion of the channel region 116 that is nearer to the first region 112 than to the second region 114. Part of the word line 102 may be disposed over a portion of the first region 112. The erase gate 104 may be arranged over the second region 114 of the substrate 110. The floating gate 106 may be arranged over a second portion of the channel region 116, that is nearer to the second region 114 than to the first region 112. Part of the floating gate 106 may also be disposed over a portion of the second region 114. The second portion of the channel region 116 under the floating gate 106 may be adjacent to the first portion of the channel region 116 under the word line 102. The floating gate 106 may be arranged between the word line 102 and the erase gate 104. The floating gate 106 has a top end 122 and a bottom end 124 that is opposite to the top end 122. The top end 122 of the floating gate 106 may face the coupling gate 108 while the bottom end 124 of the floating gate 106 may face the substrate 110. The floating gate 106 has a first side 126 that extends from the top end 122 to the bottom end 124, as well as a second side 128 that also extends from the top end 122 to the bottom end 124. The first side 126 may face the erase gate 104 while the second side 128 may face the word line 102. The coupling gate 108 may be arranged over the top end 122 of the floating gate 106.

The memory cell 100 may further include insulation materials which are not illustrated in the figures, to keep the figures simple and uncluttered. For example, the memory cell 100 may include an insulation layer disposed over the substrate 110. The insulation layer may insulate the floating gate 106 and the word line 102 from the channel region 116. The memory cell 100 may include an insulator material that insulates the erase gate 104, the coupling gate 108, the floating gate 106, and the word line 102 from one another. The insulator material may include one of silicon oxide, silicon nitride, silicon oxide stack or combinations thereof. The memory cell 100 may include an insulation member that insulates the floating gate 106 from the erase gate 104. The insulation layer, the insulator material and the insulation member may include dielectric materials, for example oxides, nitrides, or oxynitrides. The dielectric materials may be high-k dielectric materials such as aluminum oxide, hafnium oxide, silicon nitride, silicon oxynitride, or combinations thereof. The word line 102, the erase gate 104 and the coupling gate 108 may be formed from polysilicon, or other semiconductor materials.

Referring to FIG. 1B which shows a magnified view of a portion 100a of the memory cell 100, the lateral distance between the first side 126 of the floating gate 106 and a side wall 152 of the erase gate 104 may be non-uniform along the vertical direction from the top end 122 to the bottom end 124. The lateral distance between the bottom end 124 and the erase gate 104 is referred herein as the first lateral distance, and denoted as $d_1$. The lateral distance between the top end 122 and the erase gate 104 is referred herein as the second lateral distance, and denoted as $d_z$. The first lateral distance may be larger than the second lateral distance. The floating gate 106 may be wider at the top end 122 than at the bottom end 124. The floating gate 106 may taper from the top end towards the bottom end 124. The first side 126 may be inclined relative to the erase gate 104. The second side 128 may be at least substantially parallel to the side wall 152 of the erase gate 104. The second side 128 may be at least substantially parallel to a vertical direction connecting the top end 122 to the bottom end 124. The first side 126 may include an upper side portion 262 and a lower side portion 264. The lower side portion 264 may be inclined relative to the erase gate 104. The upper side portion 262 may also be inclined relative to the erase gate 104. In various embodiments, the lower side portion 264 may be at least substantially parallel to the upper side portion 262.

The floating gate 106 may have a tip 150 formed at the corner where the top end 122 and the upper side portion 262 meet. The top end 122 and the upper side portion 262 may meet at an acute angle. The tip 150 may be a sharp corner of the floating gate 106. The tip 150 may be closest to the erase gate 104 as compared to the rest of the floating gate 106. The tip 150 may focalize the electric field in the floating gate 106, thereby enhancing the local electric field at the tip 150 during an erase operation of the memory cell. As a result, the flow rate of electrons from the floating gate 106 to the erase gate 104 through the tip 150 may increase.

The erase gate 104 may include a lower portion 134 and an upper portion 132. The upper portion 132 may be wider than the lower portion 134 such that the upper portion 132 protrudes from the lower portion. The upper portion 132 may protrude from the lower portion 134 so as to partially overlie the floating gate 106. The upper portion 132 that overlies the floating gate 106 may be referred herein as the overhang portion 136 of the erase gate 104.

The first side 126 may be separated from the erase gate 104 by the insulation member (not shown in the figures). The insulation member may be formed from the same material as the insulation layer between the floating gate 106 and the channel region 116. The lower portion 134 may be adjacent to, but insulated from the floating gate 106 by a portion of the insulation member. The portion of the insulation member disposed between the lower portion 134 and the floating gate 106 may include a high-k dielectric material. Alternatively, the portion of the insulation member disposed between the lower portion 134 and the floating gate 106 may include air as the insulator.

Figure 2A:
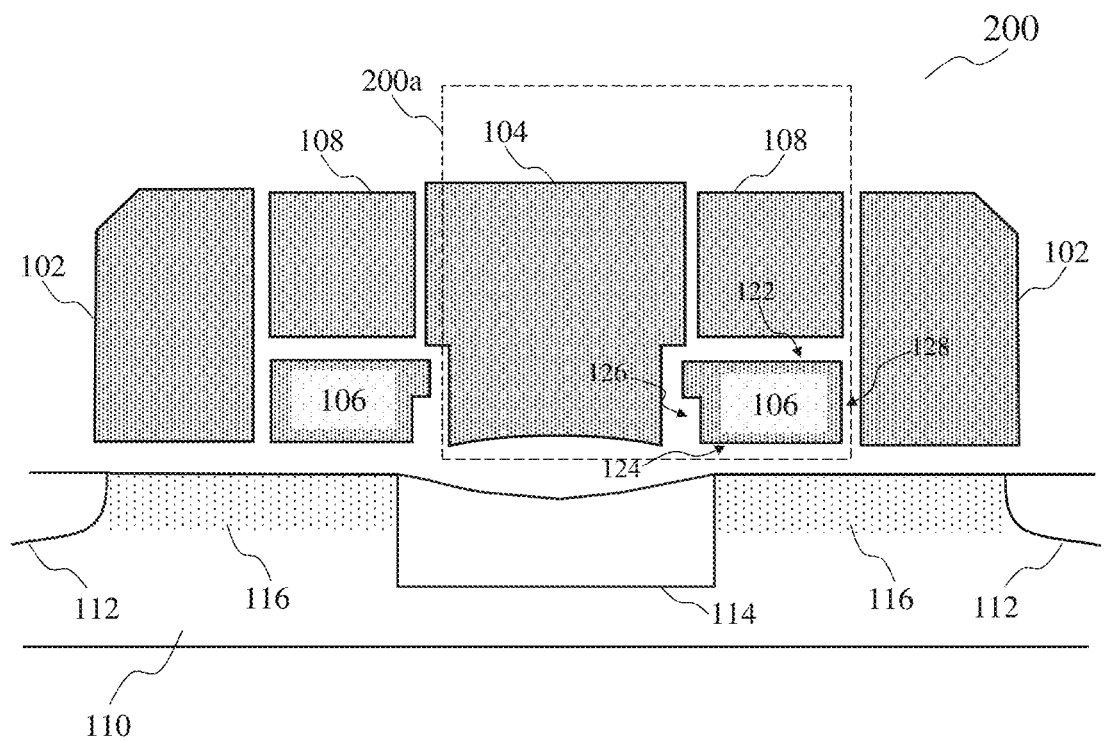
FIGS. 2A and 2B show simplified cross-sectional views of a memory cell according to various non-limiting embodiments.
Figure 2B:
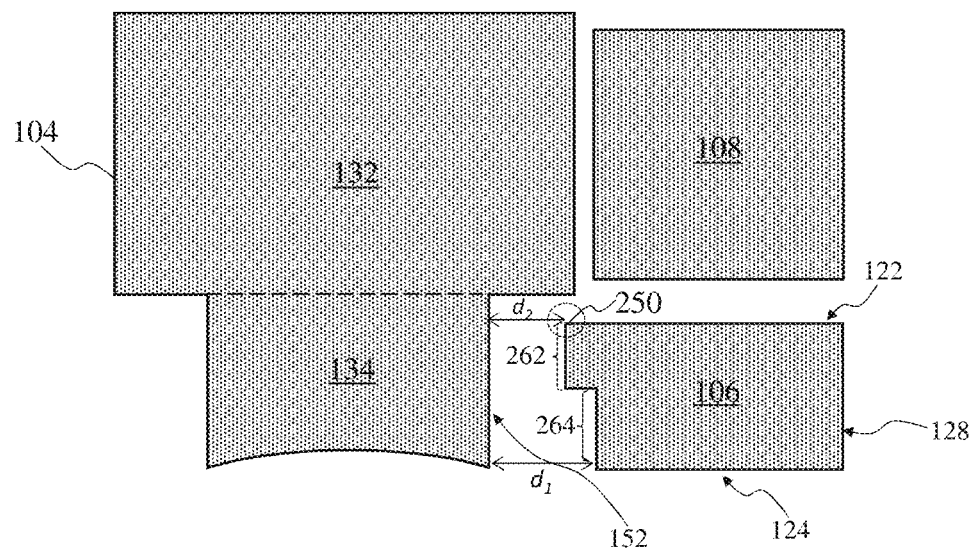

FIGS. 2A and 2B show simplified cross-sectional views of a memory cell 200 according to various non-limiting embodiments.

As shown in FIG. 2A, similar to the memory cell 100, the memory cell 200 may include a substrate 110 that includes a first region 112 and a second region 114. The memory cell 200 may further include a word line 102, an erase gate 104, a floating gate 106 and a coupling gate 108 disposed over the substrate 110. The memory cell 200 may differ from the memory cell 100, in the cross-sectional shape of its floating gate 106, which will be described further with respect to FIG. 2B.

Referring to FIG. 2B which shows a magnified view of a portion 200a of the memory cell 200, the first side 126 of the floating gate 106 may include a lower side portion 264 and an upper side portion 262. The lower side portion 264 may be spaced at a first lateral distance, denoted as $d_1$, from the erase gate 104. The upper side portion 262 may be spaced at a second lateral distance, denoted as $d_2$, from the erase gate 104. The second lateral distance may be smaller than the first lateral distance. The upper side portion 262 may be at least substantially parallel to the side wall 152 of the erase gate 104. The upper side portion 262 may be at least substantially parallel to a vertical direction connecting the top end 122 and the bottom end 124. The lower side portion 264 may also be at least substantially parallel to the side wall 152 of the erase gate 104. The lower side portion 264 may also be at least substantially parallel to the vertical direction connecting the top end 122 and the bottom end 124. The lower side portion 264 may be receded from the upper side portion 262.

The floating gate 106 may have a tip 250 formed at the corner where the top end 122 and the upper side portion 262 meet. The top end 122 and the upper side portion 262 may meet at an at least substantially right angle. Like the tip 150 of the memory cell 100, the tip 150 may be closest to the erase gate 104 as compared to the rest of the floating gate 106, and may improve the flow rate of electrons from the floating gate 106 to the erase gate 104.

The lower side portion 264 may be separated from the erase gate 104 by an insulation member (not shown in the figures). The insulation member may include a high-k dielectric material. The insulation member may also include air. The upper side portion 264 may be separated from the erase gate 104 by another insulation member (not shown in the figures). The other insulation member may be formed integral with the insulation member, and may include a high-k dielectric material.

According to various non-limiting embodiments, the ratio of the first lateral distance to the second lateral distance in the memory cell 100 and the memory cell 200 may range from about 3:2 to 5:1. In other words, the first lateral distance may be about 1.5 times to 5 times of the second lateral distance. The first lateral distance may be in a range of about 13 nm to about 33 nm. The second lateral distance may be in a range of about 6.5 nm to about 13 nm.

According to various non-limiting embodiments, the first lateral distance is larger than the second lateral distance. In other words, the gap between the erase gate 104 and the floating gate 106 along the first side 126 is non-uniform in width. The gap is narrower at the top end 122 and narrower at the bottom end 124. The shape of the floating gate 106 of the memory cell 100 and the memory cell 200 need not be limited to the shapes shown in FIGS. 1A-1B and 2A-2B.

The erase performance of the memory cells 100 and 200 may depend on the coupling ratio of the erase gate 104 and the floating gate 106, abbreviated herein as the "EG-FG coupling ratio". A low EG-FG coupling ratio may increase the electric field between the erase gate 104 and the floating gate 106, thereby aiding in the erase operation in the memory cell, and as such, is advantageous. The EG-FG coupling ratio may be expressed as a ratio of the EG-FG capacitance to the total FG capacitance, where the EG-FG capacitance refers to the capacitance between the erase gate 104 and the floating gate 106, and where the total FG capacitance refer to the total capacitance at the floating gate 106. As such, the EG-FG coupling ratio is proportional to the EG-FG capacitance. The EG-FG capacitance may depend on a thickness of the insulating member between the erase gate 104 and the floating gate 106. The EG-FG capacitance may decrease with an increase in the thickness of the insulating member. In other words, the EG-FG capacitance may decrease, with an increase in the distance between the erase gate 104 and the floating gate 106. Therefore, the EG-FG coupling ratio may decrease with an increase in the distance between the erase gate 104 and the floating gate 106. As such, it may be advantageous to have a large distance between the erase gate 104 and the floating gate 106. On the other hand, a close distance between the tip 150 or corner 250 of the floating gate 106 and the erase gate 104 may facilitate fast flow of electrons from the floating gate 106 to the erase gate 104. By having the bottom end 124 of the floating gate 106 receded from the top end 122, such that the first lateral distance is larger than the second lateral distance, the EG-FG capacitance may be lowered while maintaining a fast flow rate of electrons between the floating gate 106 and the erase gate 104.

According to various non-limiting embodiments, the floating gate 106 of the memory cell 100 or the memory cell 200 may be non-uniform in its material composition. The floating gate 106 may include an alloy of a first semiconductor material and a second semiconductor material. The first semiconductor material may include silicon. The second semiconductor material may include germanium. The alloy may include polysilicon-germanium. The presence of the second semiconductor material may enhance the oxidation rate of the alloy and the enhancement effect may depend on a concentration of the second semiconductor material in the alloy. The floating gate 106 may be formed through a deposition process. The bottom end 124 of the floating gate 106 may have a higher concentration of the second semiconductor material than the top end 122 of the floating gate 106. The higher concentration of the second semiconductor material may cause the floating gate 106 material to be removed at a faster rate at the bottom end 124 such that the bottom end 124 is further away from the erase gate 104 as compared to the top end 122. The concentration of the second semiconductor material in the floating gate 106 may be controlled through tuning the deposition process. The concentration of the second semiconductor material may increase gradually in a direction from the top end 122 towards the bottom end 124. For example, the concentration of the second semiconductor material may increase linearly from the top end 122 to the bottom end 124.

Alternatively, the floating gate 106 may be formed by implanting the first semiconductor material with a dopant that includes the second semiconductor material. The concentration of the second semiconductor material in the floating gate 106 may be controlled through the doping process.

FIGS. 3A to 3G show simplified cross-sectional views illustrating a method for fabricating the memory cell 100 or 200 according to various non-limiting embodiments. In particular, FIGS. 3A to 3E may illustrate a method of forming the floating gate 106. For clarity of illustration, some reference numerals are omitted from FIGS. 3A to 3G.

Figure 3A:
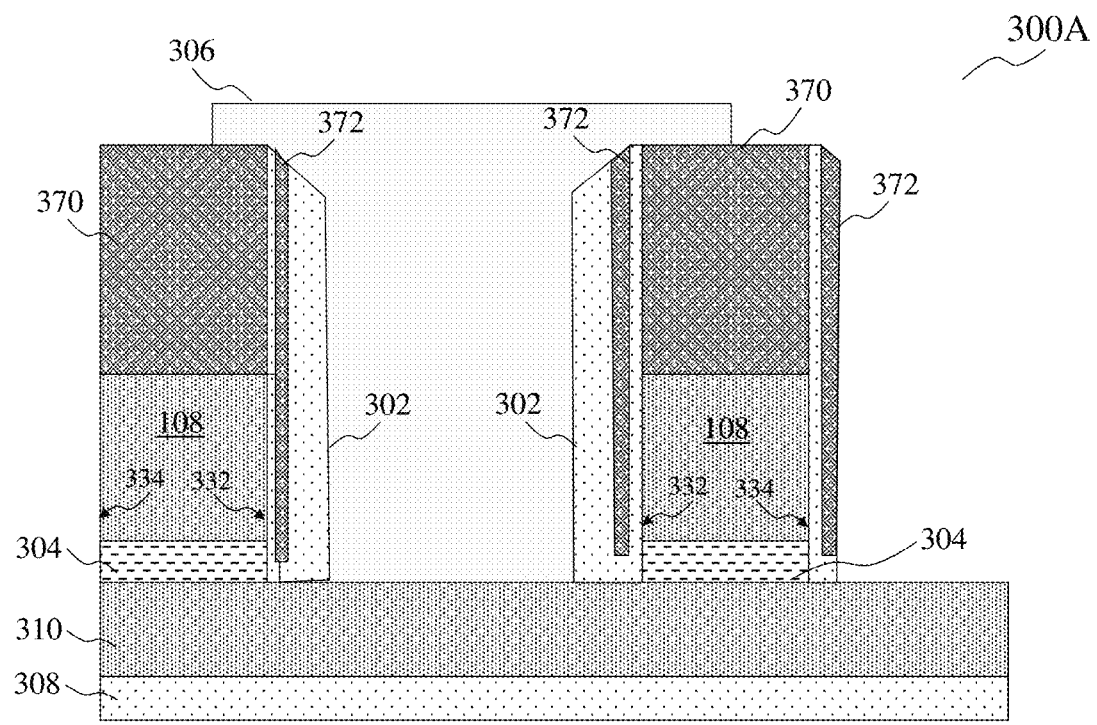
FIGS. 3A to 3G show simplified cross-sectional views illustrating a method for fabricating a memory cell according to various non-limiting embodiments.

Referring to FIG. 3A, a process 300A may include forming a floating gate layer 310 over a first insulator layer 308. The process 300A may include forming at least two coupling gates 108 over the floating gate layer 310. The coupling gates 108 may be spaced apart from each other such that there is a gap between two neighboring coupling gates 108. There may be an insulation structure 370 over each coupling gate 108. The insulation structure 370 may include an insulating material such as one of silicon dioxide, silicon nitride, or combination thereof. Each coupling gate 108 may be insulated from the floating gate layer 310 by a respective region of a second insulator layer 304. Each coupling gate 108 may have a gate-facing side 332 that faces another coupling gate 108. The respective gate-facing sides 332 of the coupling gates 108 may be adjacent to a passivation wall 302. An insulation inner layer 372 may be provided within the passivation wall 302. The insulation inner layer 372 may include an insulating material such as one of silicon dioxide or silicon nitride or combination thereof. The material composition of the insulation inner layer 372 may differ from the material composition of the insulation structure 370. The process 300A may include depositing a resist material 306 between the passivation walls 302. The resist material 306 may also be deposited partially over the coupling gates 108. The process 300A may further include patterning the resist material 306 such that it does not contact the word line-facing sides 334 of the coupling gate 108.

Figure 3B:
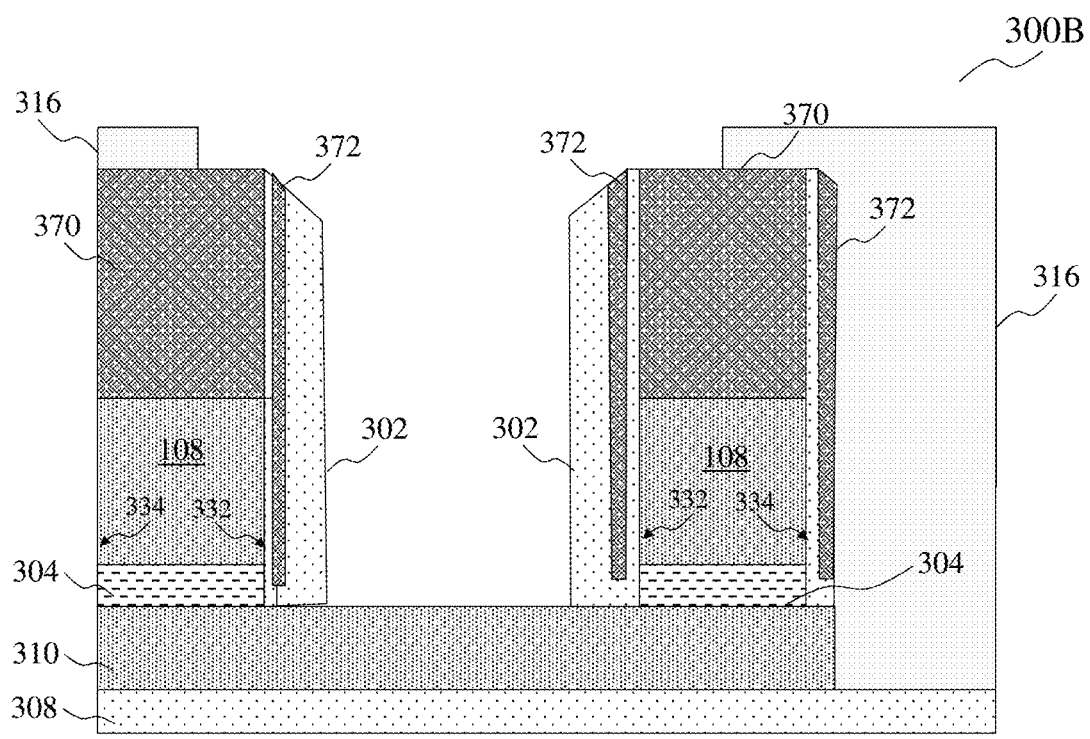

FIG. 3B shows a process 300B. The process 300B may include removing part of the floating gate layer 310 at the word line-facing sides 334 of the coupling gates 108, by etching through the patterned resist material 306. The resist material 306 may be removed after that. The process 300B may further include forming an etch mask 316 that includes a mask material. Forming the etch mask 316 may include depositing the mask material onto the semiconductor structure resulting from the process 300A. The mask material may cover the word line-facing sides 334 of each of the coupling gates 108. The word line-facing side 334 of the coupling gate 108 may be opposite to the gate-facing side 332. The etch mask 316 may have an opening over the gap between two neighboring coupling gates 108.

Figure 3C:
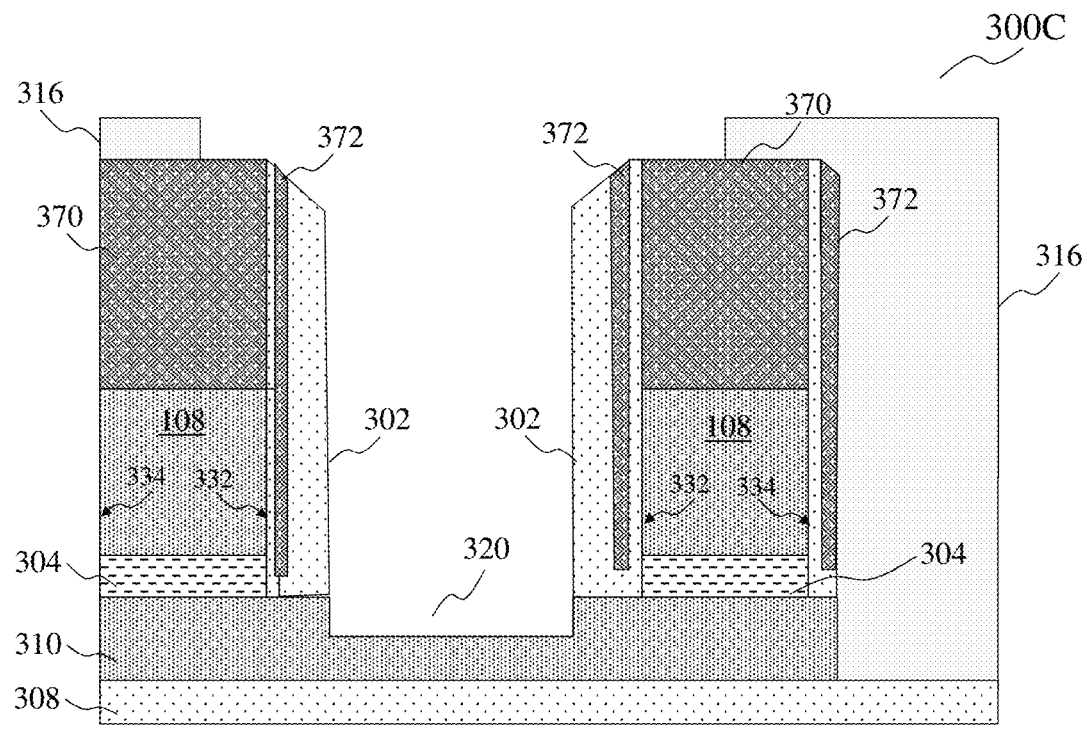

FIG. 3C shows a process 300C. The process 300C may include removing part of the floating gate layer 310. The process 300C may include forming a cavity 320 in the floating gate layer 310, between the neighboring coupling gates 108. Forming the cavity 320 may include vertically removing part of the floating gate layer 310, by etching the floating gate layer 310 through the opening of the etch mask 316.

Figure 3D:
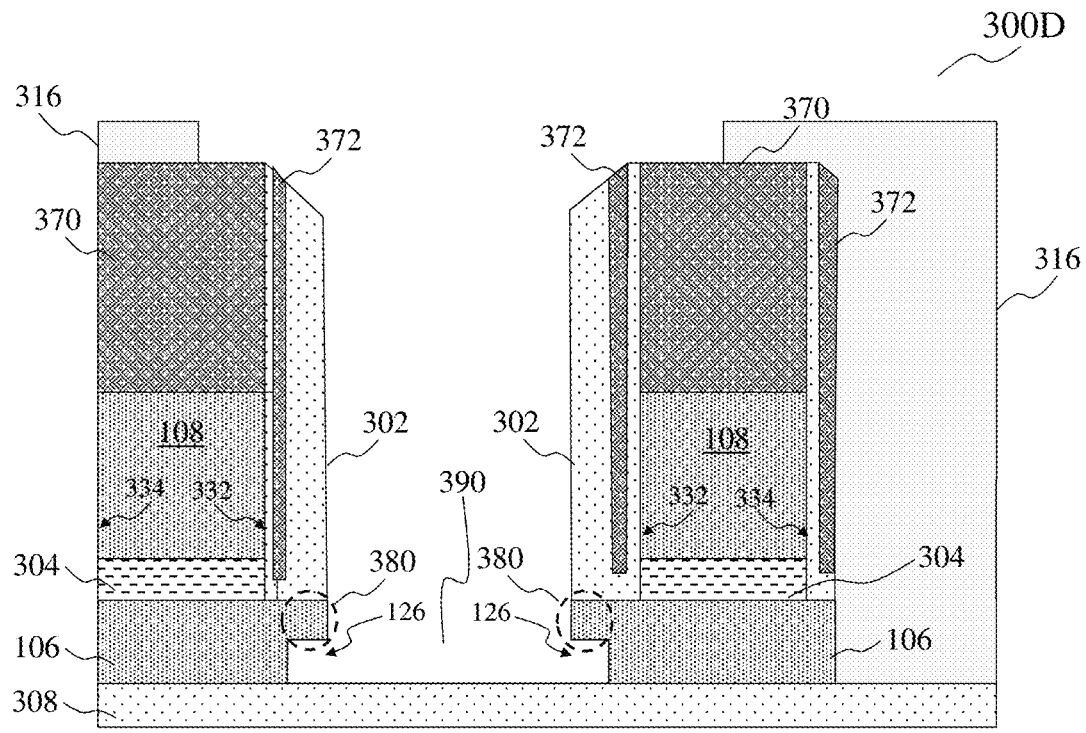

FIG. 3D shows a process 300D. The process 300D may include forming a through hole 390 in the floating gate layer 310 such that the floating gate layer 310 is separated into two floating gates 106. The process 300D may include etching the floating gate layer 310 through the cavity 320 until the underlying first insulator layer 308 is revealed. The process 300D may include isotropically removing part of the floating gate layer 310 from within the cavity 320. The etching process may result in a lateral etch at the bottom of the floating gate layer 310, where a bottom of the through hole 390 is wider than the top opening of the through hole. The floating gate layer 310 may include top corners 380 which may be protected by being laterally etched, by a passivation sidewall layer (not shown in the figures) that is formed in the process 300C.

Figure 3E:
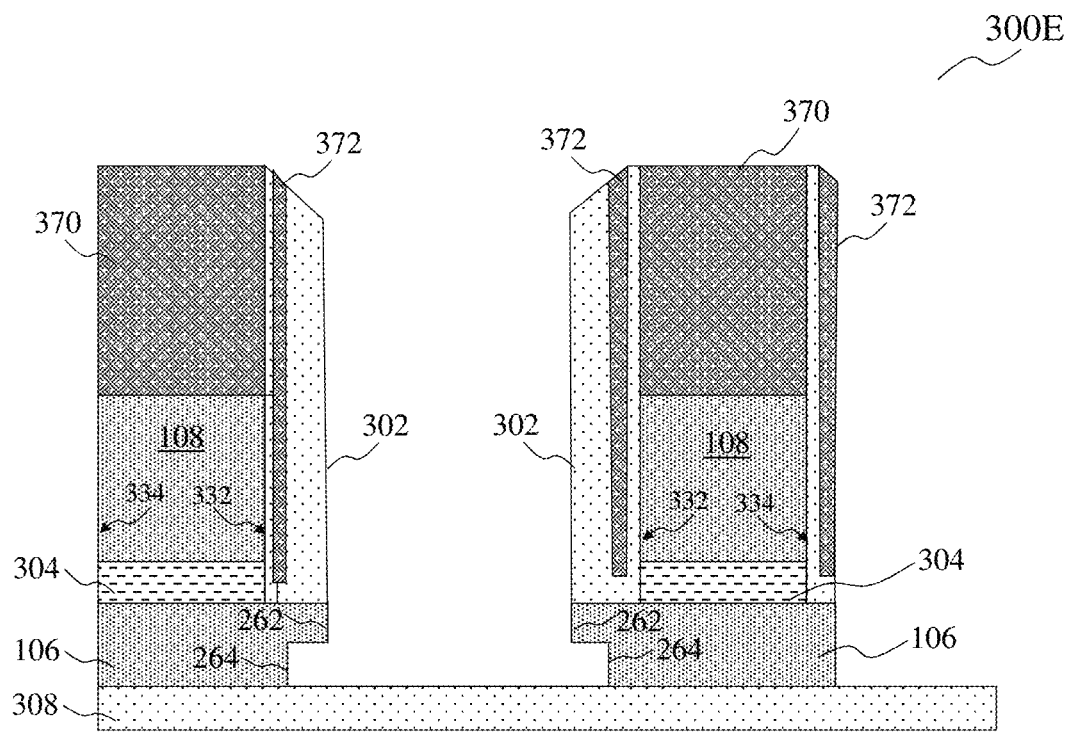

FIG. 3E shows a process 300E. The process 300E may include stripping off the etch mask 316, from the semiconductor structure resulting from the process 300D.

Figure 3F:
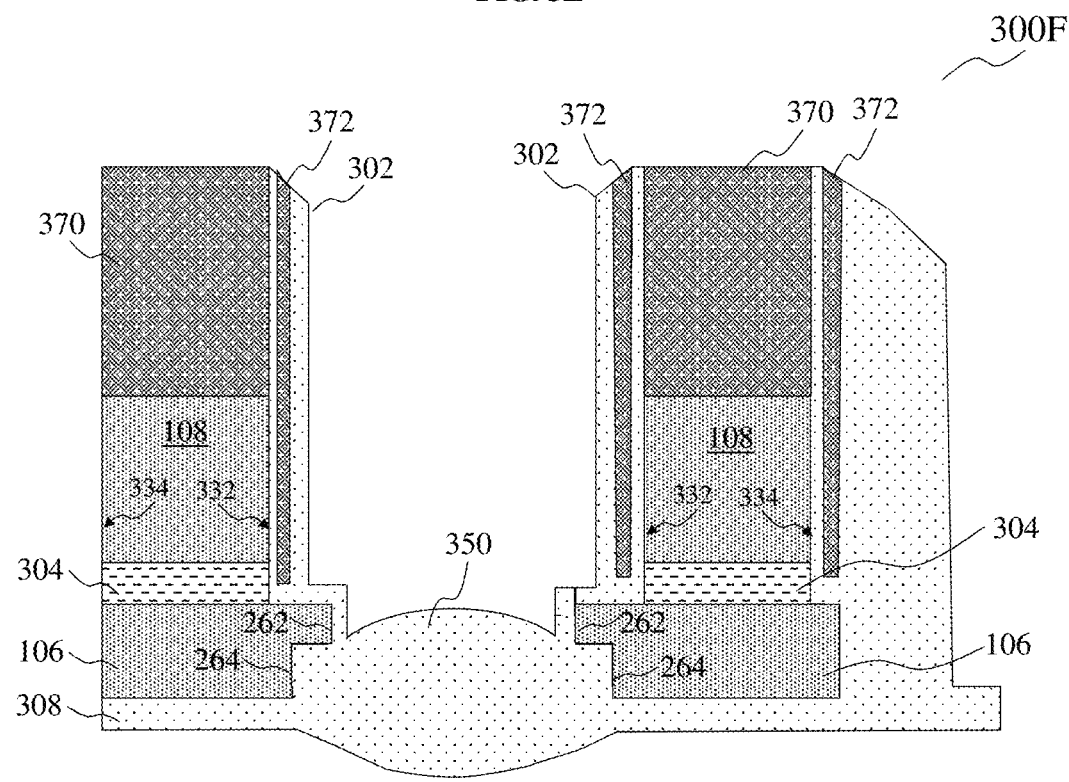

FIG. 3F shows a process 300F. The process 300F may include forming an insulator member on the first side 126 of each floating gate 106. The process 300F may include depositing an insulating material 350, such as an oxide onto the semiconductor structure resulting from the process 300E. The process 300F may further include growing the insulation material 350 through an oxidation process. The oxidation process may cause the insulation material 350 to take on an oval-shaped profile. The insulating material 350 may contact both the upper side portion 262 and the lower side portion 264 of the first side 126 of each floating gate 106. The insulating material 350 may also be deposited between the floating gates 106. Following the process 300F, polysilicon may be deposited to form a polysilicon structure that includes the erase gate 104 and the word line 102. An etch and/or a CMP process may be performed to disconnect the erase gate 104 from the word line 102.

Figure 3G:
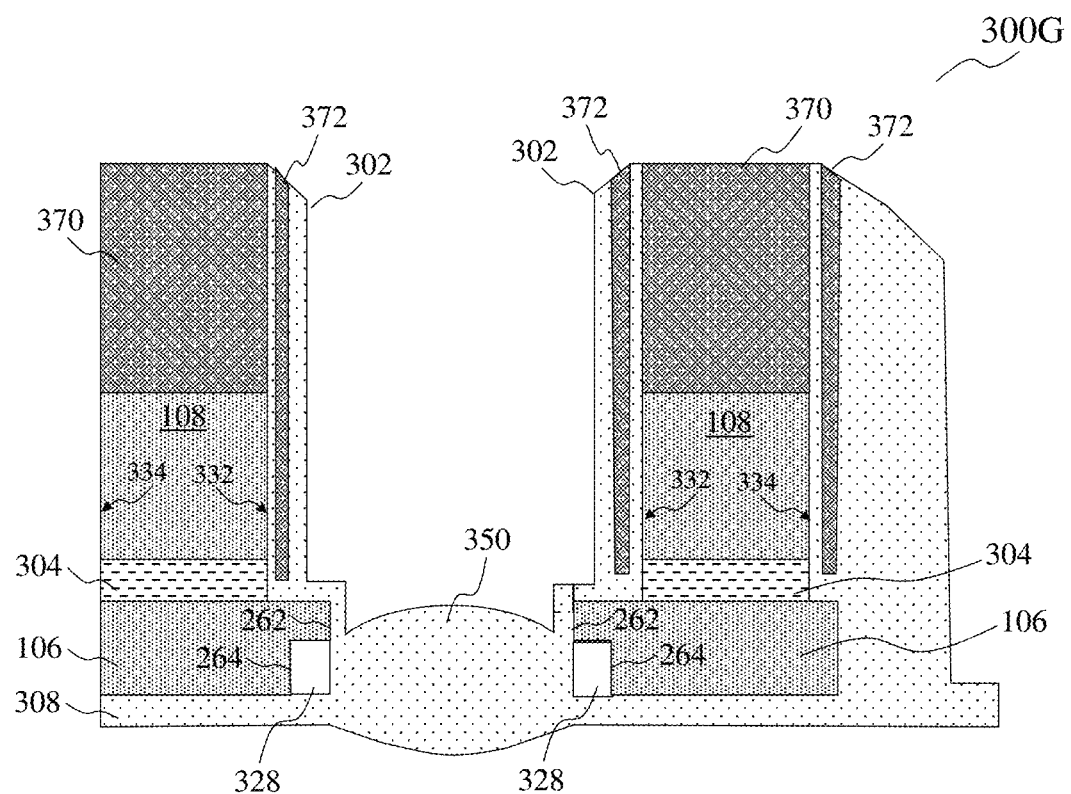

FIG. 3G shows a process 300G, which may be an alternative to the process 300F. The process 300G may be similar to the process 300F, in that it may include depositing an insulating material 350, such as an oxide, onto the semiconductor structure resulting from the process 300E. The process 300F may further include growing the insulation material 350 through an oxidation process. The process 300G differs from the process 300F, in that the insulating material 350 may not fully fill out the through hole 390 such that there is an air gap 328 between the insulating material 350 and the lower side portion 264. The insulating material 350 may contact only on the upper side portion 262 but not the lower side portion 264 of the floating gates 106. The air in the air gap 328 may also serve as an insulator or dielectric.

The EG-FG coupling ratio may be lower, when the insulating member between the erase gate 104 and the floating gate 106 is air.

Following the process 300F or 300G, the word line 102, the erase gate 104 may be formed on the semiconductor structure to form the memory cell 100 or 200. A logic device (not shown) may also be fabricated onto the semiconductor structure.

Figure 4A:
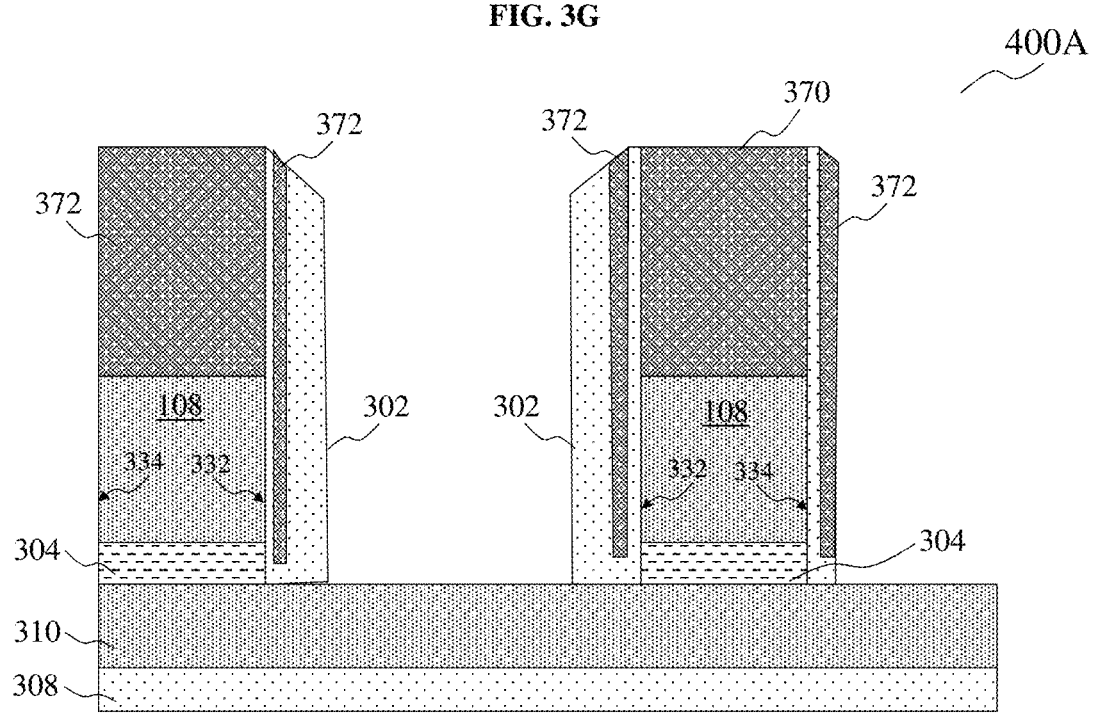
FIGS. 4A to 4C show simplified cross-sectional views illustrating an alternative method for fabricating a memory cell according to various non-limiting embodiments.
Figure 4B:
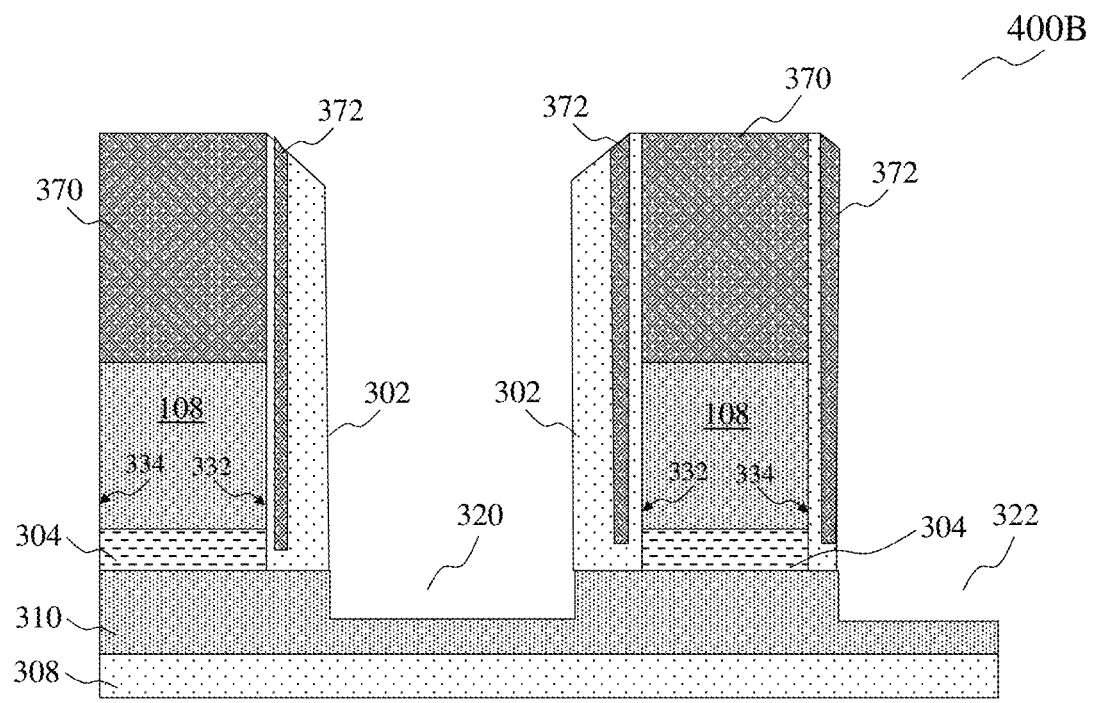
Figure 4C:
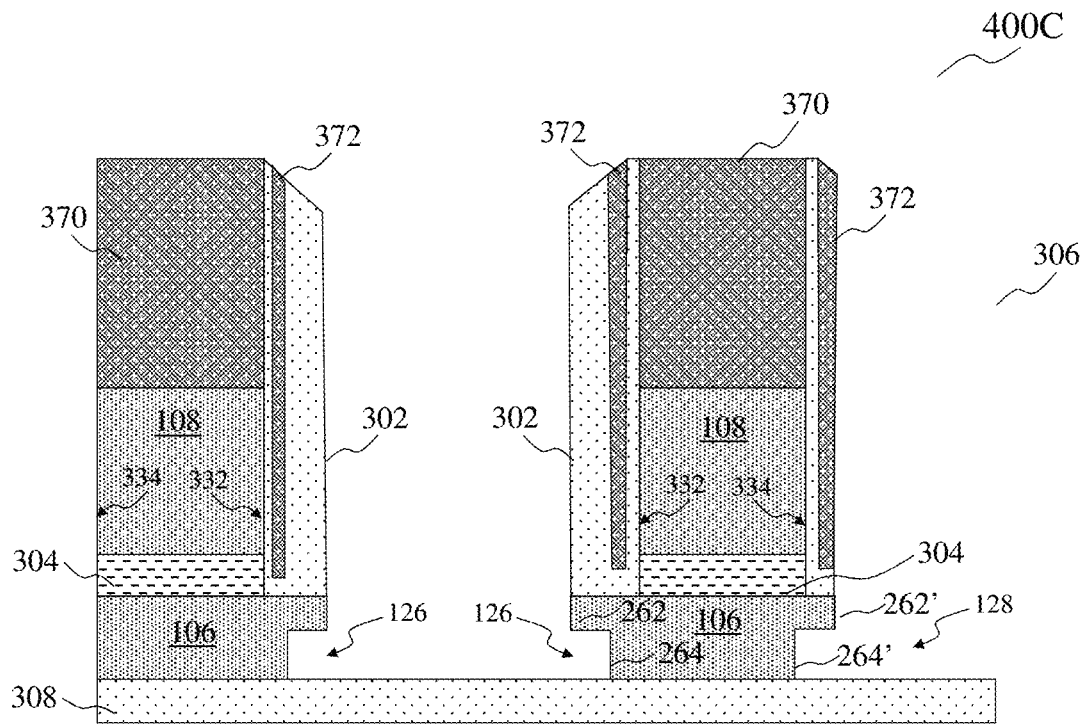

FIGS. 4A to 4C show simplified cross-sectional views illustrating an alternative method for fabricating the memory cell 100 or 200 according to various non-limiting embodiments. In particular, FIGS. 4A to 4C may illustrate a method of forming the floating gate 106. For clarity of illustration, some reference numerals are omitted from FIGS. 4A to 4C.

Referring to FIG. 4A, a process 400A may include forming a floating gate layer 310 over a first insulator layer 308. The process 400A may include forming at least two coupling gates 108 over the floating gate layer 310. The coupling gates 108 may be spaced apart from each other such that there is a gap between two neighboring coupling gates 108. Each coupling gate 108 may be insulated from the floating gate layer 310 by a respective region of a second insulator layer 304. Each coupling gate 108 may have a gate-facing side 332 that faces another coupling gate 108. A passivation wall 302 may be disposed on the gate-facing side 332 of each coupling gate 108. The process 400A may be similar to the process 300A, but without depositing the resist material 306 between the passivation walls 302.

Referring to FIG. 4B, the process 400B may include removing part of the floating gate layer 310. The process 400B may include forming a cavity 320 in the floating gate layer 310, between the neighboring coupling gates 108. Forming the cavity 320 may include removing part of the floating gate layer 310 vertically, for example, by etching. As there is no etch mask or resist material formed on the semiconductor structure, the floating gate layer 310 may be etched on both sides of the coupling gate 108. As such, in addition to the cavity 320, another cavity 322 may be formed on the word line-facing side 334 of the coupling gate 108.

Referring to FIG. 4C, the process 400C may be similar to the process 300D. The process 400C may include forming a through hole in the floating gate layer 310 such that the floating gate layer 310 is separated into two floating gates 106. The process 400A may include etching the floating gate layer 310 through the cavity 320 and through the cavity 322 until the underlying first insulator layer 308 is revealed. The process 400C may include isotropically removing part of the floating gate layer 310 from within the cavities 320 and 322. As the etching process is performed through both cavities 320 and 322, both the first side 126 and the second side 128 of the floating gate 106 may have an undercut profile. In other words, the lower side portion 264 of the first side 126 may be receded as compared to the upper side portion 262. Similarly, the second side 128 of the floating gate 106 has an upper side portion 262' and a lower side portion 264', where the lower side portion 264' is receded as compared to the upper side portion 262'.

FIGS. 5A to 5D show simplified cross-sectional views illustrating a method for fabricating the memory cell 100 or 200 according to various non-limiting embodiments. For clarity of illustration, some reference numerals are omitted from FIGS. 5A to 5D.

Figure 5A:
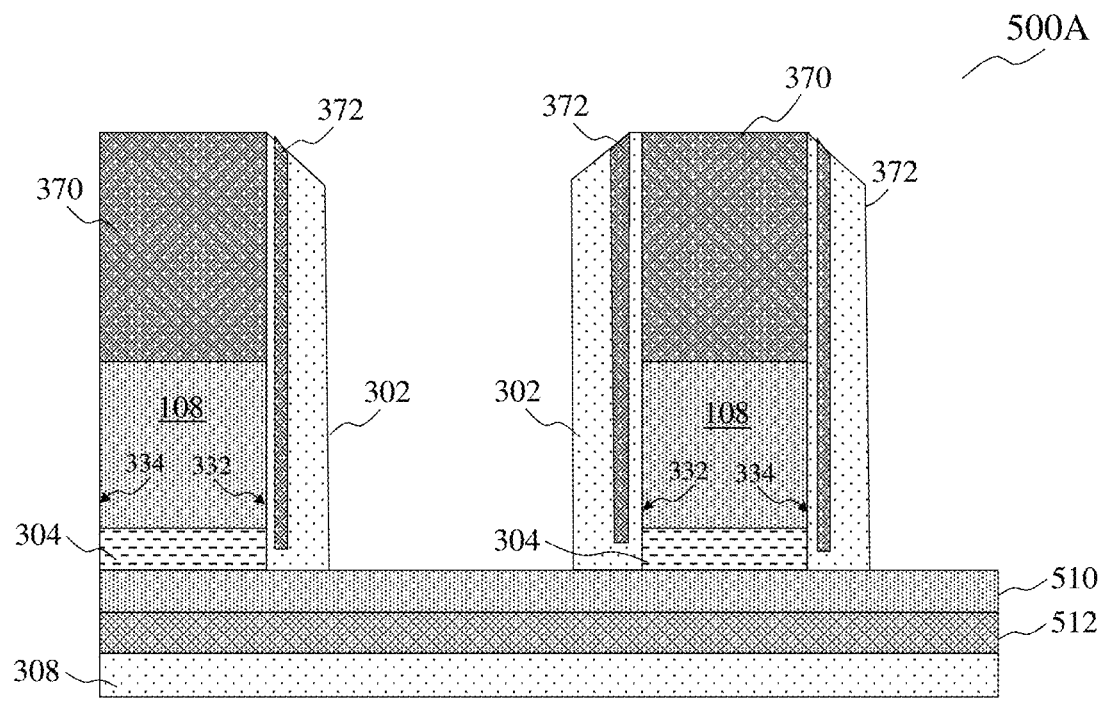
FIGS. 5A to 5D show simplified cross-sectional views illustrating a method for fabricating a memory cell according to various non-limiting embodiments.

Referring to FIG. 5A, a process 500A may include forming a first floating gate layer 512 and forming a second floating gate layer 510 over the first floating gate layer 512. The process 500A may include providing a first insulator layer 308 under the first floating gate layer 512. The process 500A may include forming at least two coupling gates 108 over the second floating gate layer 510. The coupling gates 108 may be spaced apart from each other such that there is a gap between two neighboring coupling gates 108. Each coupling gate 108 may be insulated from the second floating gate layer 510 by a respective region of a second insulator layer 304. Each coupling gate 108 may have a gate-facing side 332 that faces another coupling gate 108. The process 500A may include disposing a passivation wall 302 on the gate-facing side 332 of each coupling gate 108. Both the first floating gate layer 512 and the second floating gate layer 510 may include a semiconductor alloy, such as polysilicon-germanium. The alloy may include a first semiconductor material and a second semiconductor material. The first semiconductor material may include poly silicon. The second semiconductor material may include germanium. The second floating gate layer 510 may have a lower concentration of the second semiconductor material, as compared to the first floating gate layer 512.

Figure 5B:
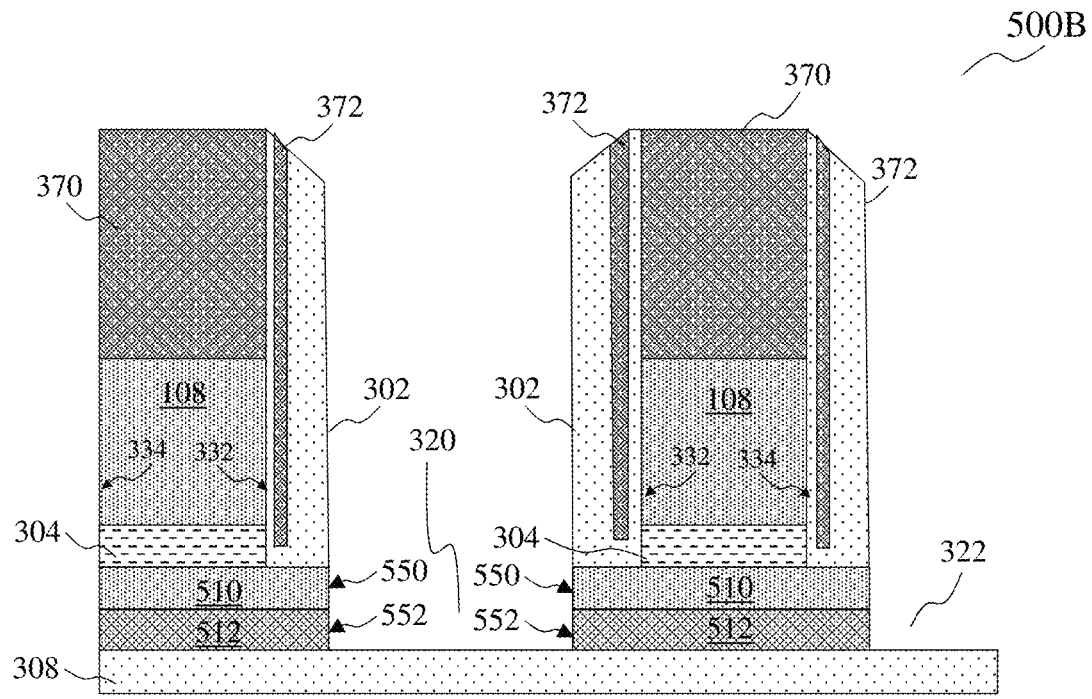

FIG. 5B shows a process 500B. The process 500B may include vertically removing parts of the first floating gate layer 512 to form a side surface 552 of the first floating gate layer 512 and removing parts of the second floating gate layer 510 to form a side surface 550 of the second gate layer 510. The process 500B may include etching both the first floating gate layer 512 and the second floating gate layer 510 to vertically remove parts of the first floating gate layer 512 and the second floating gate layer 510 at both the gate-facing side 332 and the word line-facing side 334 of the coupling gates 108. As a result, a cavity 320 is formed between the neighboring coupling gates 108, and another cavity 322 is formed at the word line-facing side of the coupling gate 108. The side surfaces 552 and 550 may face the cavity 320.

Figure 5C:
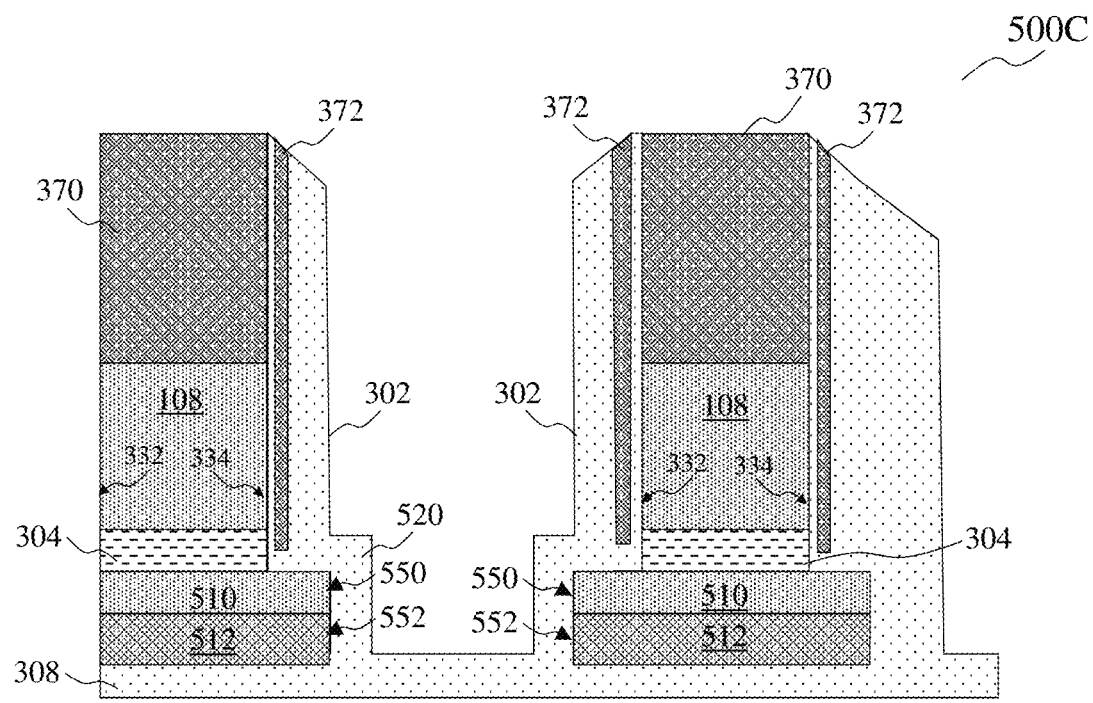

FIG. 5C shows a process 500C. The process 500C may include depositing an oxide material 520 into the cavity 320. The oxide material 520 may be coated on the side surfaces 550 and 552.

Figure 5D:
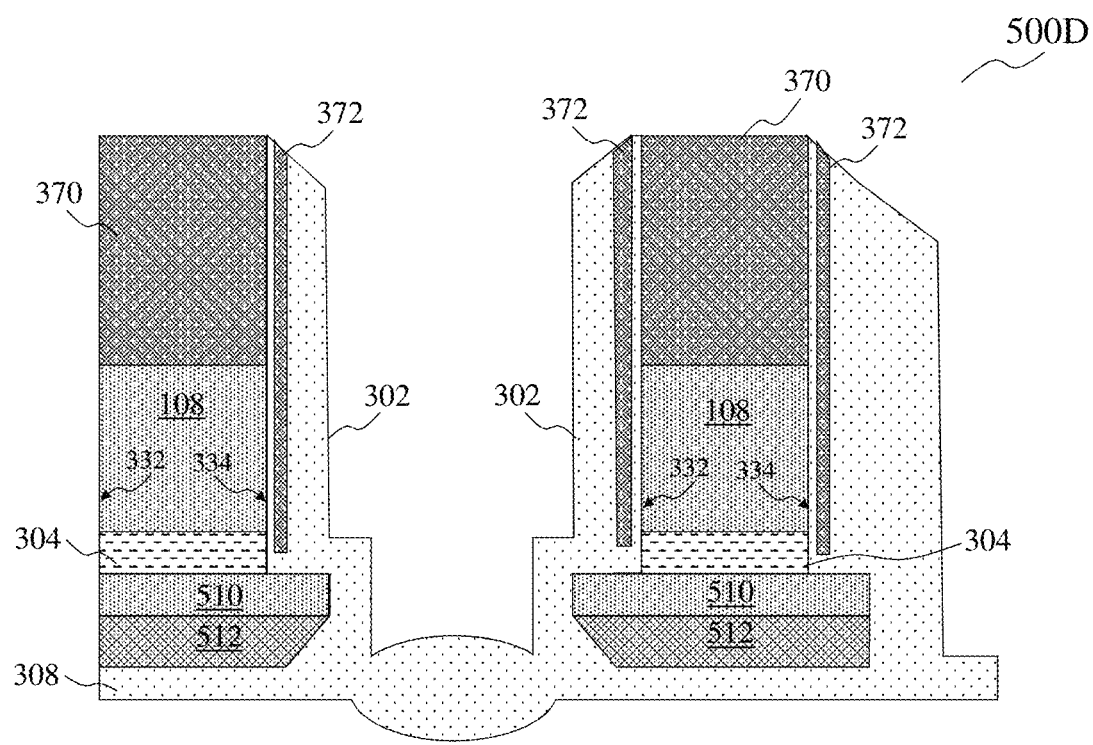

FIG. 5D shows a process 500D. The process 500D may include oxidizing the side surfaces 550 and 552. As the first floating gate layer 512 has a higher concentration of the second semiconductor material, it may oxidize at a faster rate as compared to the second floating gate layer 510. Consequently, the first floating gate layer 512 may recede from the side surface 552, as the side of the first floating gate layer 512 is oxidized to form an insulation member.

In an alternative embodiment, the process 500A may include forming a floating gate layer stack. The floating gate layer stack may include a plurality of floating gate layers with decreasing concentration of the second semiconductor material from the bottom floating gate layer to the top floating gate layer. The concentration of the second semiconductor material may decrease gradually from the bottom floating gate layer to the top floating gate layer. For example, the concentration of the second semiconductor material may decrease linearly from the bottom floating gate layer to the top floating gate layer. The process 500B may include etching each floating gate layer in the floating gate layer stack to vertically remove parts of each floating gate layer at both the gate-facing side 332 and the word line-facing side 334 of the coupling gates 108. As a result, a cavity 320 is formed between the neighboring coupling gates 108, and another cavity 322 is formed at the word line-facing side of the coupling gate 108. Due to the multiple layers with decreasing concentration of the second semiconductor material, during the process 500D, the floating gate layers may oxidize at decreasing rates, from the bottom floating gate layer to the top floating gate layer. As a result, the floating gate 106 formed from the floating gate layer stack may have an inclined side wall that is furthest away from the erase gate 104, at the bottom floating gate layer, similar to FIG. 1A.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory cell comprising:
  a substrate of a first conductivity type, the substrate having first and second regions of a second conductivity type spaced apart and defining a channel region therebetween;
  a word line arranged over a portion of the channel region nearer to the first region;
  an erase gate arranged over the second region;
  a floating gate arranged over another portion of the channel region nearer to the second region and between the word line and the erase gate, the floating gate comprising a top end, a bottom end, a first side extending from the top end to the bottom end and facing the erase gate, and a second side extending from the top end to the bottom end and facing the word line,
  wherein a first lateral distance between the bottom end of the floating gate and the erase gate is larger than a second lateral distance between the top end of the floating gate and the erase gate; and
  a coupling gate arranged over the top end of the floating gate.

2. The memory cell of claim 1, wherein the first side of the floating gate is inclined relative to the erase gate.

3. The memory cell of claim 1, wherein the first side of the floating gate comprises a lower side portion and an upper side portion, wherein the lower side portion is spaced the first lateral distance from the erase gate, and wherein the upper side portion is at least substantially parallel to the erase gate and spaced the second lateral distance from the erase gate.

4. The memory cell of claim 3, wherein the lower side portion is at least substantially parallel to the erase gate.

5. The memory cell of claim 1, wherein a ratio between the first distance and the second distance is in a range of 3:2 to 5:1.

6. The memory cell of claim 1, further comprising:
  an insulation member between the first side of the floating gate and the erase gate.

7. The memory cell of claim 6, wherein the insulation member comprises air.

8. The memory cell of claim 6, wherein the insulation member comprises high-k dielectric material.

9. The memory cell of claim 1, wherein the erase gate comprises a lower portion and an upper portion, the upper portion being wider than the lower portion such that the upper portion protrudes from the lower portion.

10. The memory cell of claim 9, wherein the upper portion protrudes from the lower portion so as to partially overlie the floating gate, wherein the lower portion is adjacent to but insulated from the floating gate.

11. The memory cell of claim 1, wherein the substrate has an upper surface, wherein each of the first and second regions are provided along the upper surface.

12. The memory cell of claim 1, further comprising:
  an insulation layer over the substrate, the insulating layer insulating the floating gate and word line from the channel region.

13. The memory cell of claim 1, further comprising:
  an insulator material insulating the erase gate, the coupling gate, the floating gate, and the word line from one another.

14. The memory cell of claim 1, wherein the floating gate comprises polysilicon-germanium, wherein the bottom end of the floating gate comprises a higher concentration of germanium than the top end of the floating gate.

15. The memory cell of claim 14, wherein a concentration of germanium increases linearly in a direction from the top end of the floating gate towards the bottom end of the floating gate.

16. A method of forming a memory cell, the method comprising:
  forming a substrate of a first conductivity type with first and second regions of a second conductivity type spaced apart therein so as to define a channel region therebetween;
  forming a word line over a portion of the channel region nearer to the first region;
  forming an erase gate over the second region;
  forming a floating gate over another portion of the channel region nearer to the second region and between the word line and the erase gate, the floating gate comprising a top end, a bottom end, a first side extending from the top end to the bottom end and facing the erase gate, and a second side extending from the top end to the bottom end and facing the word line, wherein a first lateral distance between the bottom end of the floating gate and the erase gate is larger than a second lateral distance between the top end of the floating gate and the erase gate; and
  forming a coupling gate over the top end of the floating gate.

17. The method of claim 16, wherein forming the floating gate comprises:
  forming a floating gate layer; and
  removing part of the floating gate layer.

18. The method of claim 17, wherein removing part of the floating gate layer comprises:
  vertically removing part of the floating gate layer; and
  isotropically removing part of the floating gate layer.

19. The method of claim 18, wherein forming the floating gate layer comprises:
  forming a first floating gate layer; and
  forming a second floating gate layer over the first floating gate layer, wherein the second floating gate layer has a lower concentration of germanium than the first floating gate layer.

20. The method of claim 19, wherein removing part of the floating gate layer comprises:
  vertically removing parts of the first floating gate layer and the second floating gate layer to form a respective side surface for each of the first floating gate layer and the second gate layer; and
  oxidising the respective side surfaces of the first floating layer and the second floating layer.

* * * * *